United States Patent
Mao et al.

(10) Patent No.: US 9,584,116 B2
(45) Date of Patent: Feb. 28, 2017

(54) METHOD AND APPARATUS FOR CURRENT/POWER BALANCING

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Yincan Mao, Blacksburg, VA (US); Chi-Ming Wang, Ann Arbor, MI (US); Zichen Miao, Blacksburg, VA (US); Khai Ngo, Blacksburg, VA (US)

(73) Assignees: Toyota Motor Engineering & Manufacturing North America, Inc., Erlanger, KY (US); Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 15/009,867

(22) Filed: Jan. 29, 2016

(65) Prior Publication Data

US 2016/0352330 A1     Dec. 1, 2016

Related U.S. Application Data

(63) Continuation-in-part of application No. 14/724,408, filed on May 28, 2015.

(51) Int. Cl.
*H03K 3/00* (2006.01)
*H03K 17/687* (2006.01)
*G05F 3/16* (2006.01)

(52) U.S. Cl.
CPC ............. *H03K 17/687* (2013.01); *G05F 3/16* (2013.01)

(58) Field of Classification Search
CPC .................................................. H03K 17/687
See application file for complete search history.

(56) References Cited

U.S. PATENT DOCUMENTS

| | | | |
|---|---|---|---|
| 5,717,359 A | 2/1998 | Matsui et al. | |
| 6,084,790 A * | 7/2000 | Wong .................. | H02M 3/1584 323/272 |

(Continued)

OTHER PUBLICATIONS

Dominik Bortis, et al.. "Active Gate Control for Current Balancing of Parallel-Connected IGBT Modules in Solid-State Modulators." IEEE, Transactions on Plasma Science, vol. 36, No. 5, Oct. 2008, pp. 2632-2637.

(Continued)

*Primary Examiner* — Daniel Puentes
(74) *Attorney, Agent, or Firm* — Oblon, McClelland, Maier & Neustadt, L.L.P.

(57) ABSTRACT

Aspects of the disclosure provide a power circuit that includes a first switch circuit in parallel with a second switch circuit. The first switch circuit and the second switch circuit are coupled to a first driving node, a second driving node, a source node and a drain node via interconnections. The power circuit receives a control signal between the first driving node and the second driving node to control a current flowing from the drain node to the source node through the first switch circuit and the second switch circuit. In the power circuit, a first interconnection and a second interconnection of the interconnections are inductively coupled to balance the current flowing through the first switch circuit and the second switch circuit.

20 Claims, 13 Drawing Sheets

(56) References Cited

U.S. PATENT DOCUMENTS

| | | |
|---|---|---|
| 6,441,673 B1 | 8/2002 | Zhang |
| 6,603,291 B2 | 8/2003 | Wheeler et al. |
| 7,952,418 B2 | 5/2011 | McDonald et al. |
| 8,669,821 B2 | 3/2014 | Hosoda |
| 8,711,582 B2 | 4/2014 | Stuler et al. |
| 9,000,601 B2 | 4/2015 | Azuma et al. |
| 9,048,722 B2 | 6/2015 | Sun et al. |
| 2007/0290745 A1 | 12/2007 | Vitzilaios et al. |
| 2011/0291582 A1 | 12/2011 | Wei et al. |
| 2012/0235663 A1 | 9/2012 | Bayerer et al. |
| 2013/0214842 A1 | 8/2013 | Zeng et al. |
| 2014/0203559 A1 | 7/2014 | Wagoner et al. |
| 2014/0362627 A1 | 12/2014 | Sun et al. |

OTHER PUBLICATIONS

Rodrigo Alvarez, et al., "A New Delay Time Compensation Principle for Parallel Connected IGBTs," IEEE, Energy Conversion Congress and Exposition (ECCE), Sep. 2011, pp. 3000-3007.

Yang Xue, et al., "Active Current Balancing for Parallel-Connected Silicon Carbide MOSFETs," IEEE, Energy Conversion Congress and Exposition (ECCE), Sep. 2013, pp. 1563-1569.

Gangyao Wang, et al., "Dynamic and Static Behavior of Packaged Silicon Carbide MOSFETs in Paralleled Applications," Twenty-Ninth Annual IEEE, Applied Power Electronics Conference and Exposition (APEC), Mar. 2014, pp. 1478-1483.

Zheng Chen, et al., "Experimental Parametric Study of the Parasitic Inductance Influence on MOSFET Switching Characteristics," IEEE, International Power Electronics Conference (IPEC), 2010, pp. 164-169.

Zheng Chen, et al., "Experimental Parametric Study of the Parasitic Inductance Influence on MOSFET Switching Characteristics", IEEE International Power Electronics Conference (IPEC), Jun. 2010, pp. 164-169.

Gangyao Wang, et al., "Dynamic and Static Behavior of Packaged Silicon Carbide MOSFETs in Paralleled Applications", Twenty-Ninth Annual IEEE, Applied Power Electronics Conference and Exposition (APEC), 2014, pp. 1478-1483.

Dominik Bortis, et al., "Active Gate Control for Current Balancing of Parallel-Connected IGBT Modules in Solid-State Modulators", IEEE Transactions on Plasma Science, vol. 36, No. 5, Oct. 2008, pp. 2632-2637.

Rodrigo Alvarez, et al., "A New Delay Time Compensation Principle for Parallel Connected IGBTs", IEEE Energy Conversion Congress and Exposition (ECCE), Sep. 2011, pp. 3000-3007.

Yang Xue, et al., "Active Current Balancing for Parallel-Connected Silicon Carbide MOSFETs", IEEE Energy Conversion Congress and Exposition (ECCE), Sep. 2013, pp. 1563-1569.

* cited by examiner

METHOD AND APPARATUS FOR CURRENT/POWER BALANCING

INCORPORATION BY REFERENCE

This application is a continuation-in-part (CIP) application of U.S. patent application Ser. No. 14/724,408, "Method and Apparatus for Current/Power Balancing" filed on May 28, 2015. The entire disclosure of the above-identified application is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A power module may use parallel power components to increase power capacity. For the parallel power components, equalizing current/power among the power components provides various benefits, such as improving component utilization, saving cost, improving system reliability. In an example, to equalize current/power among parallel power components, U.S. Patent Application Publication 2012/0235663 discloses a driver circuit to provide respective gate driver signals to drive the parallel power components.

SUMMARY

Aspects of the disclosure provide a power circuit that includes a first switch circuit in parallel with a second switch circuit. The first switch circuit and the second switch circuit are coupled to a first driving node, a second driving node, a source node and a drain node via interconnections. The power circuit receives a control signal between the first driving node and the second driving node to control a current flowing from the drain node to the source node through the first switch circuit and the second switch circuit. In the power circuit, a first interconnection and a second interconnection of the interconnections are inductively coupled to balance the current flowing through the first switch circuit and the second switch circuit.

According to an aspect of the disclosure, the first interconnection is among first interconnections that interconnect the first switch circuit to the first driving node, the second driving node, the source node and the drain node, and the second interconnection is among second interconnections that interconnect the second switch circuit to the first driving node, the second driving node, the source node and the drain node.

In an embodiment, the first interconnections have a corresponding third interconnection to the second interconnection, and parasitic inductances introduced by the first interconnection and the third interconnection are in a directly coupled state. The second interconnections have a corresponding fourth interconnection to the first interconnection, and the third interconnection and the fourth interconnection are inductively coupled.

In an example, the first interconnection interconnects a gate terminal of the first switch circuit to the first driving node, and the second interconnection interconnects a drain terminal of the second switch circuit to the drain node.

In another example, the first interconnection interconnects a gate terminal of the first switch circuit to the first driving node, and the second interconnection interconnects a source terminal of the second switch circuit to the source node.

In another example, the first interconnection interconnects a source terminal of the first switch circuit to the second driving node, and the second interconnection interconnects a drain terminal of the second switch circuit to the drain node.

In another example, the first interconnection interconnects a source terminal of the first switch circuit to the second driving node, and the second interconnection interconnects a source terminal of the second switch circuit to the source node.

According to another aspect of the disclosure, the first interconnection and the second interconnection are among interconnections that interconnect the first switch circuit to the first driving node, the second driving node, the source node and the drain node. Parasitic inductances introduced by the first interconnection and the second interconnection are in an inversely coupled state.

In an example, the first interconnection interconnects a gate terminal of the first switch circuit to the first driving node, and the second interconnection interconnects a drain terminal of the first switch circuit to the drain node.

In another example, the first interconnection interconnects a gate terminal of the first switch circuit to the first driving node, and the second interconnection interconnects a source terminal of the first switch circuit to the source node.

In another example, the first interconnection interconnects a source terminal of the first switch circuit to the second driving node, and the second interconnection interconnects a drain terminal of the first switch circuit to the drain node.

In another example, the first interconnection interconnects a source terminal of the first switch circuit to the second driving node, and the second interconnection interconnects a source terminal of the first switch circuit to the source node.

According to an aspect of the disclosure, the first interconnection and the second interconnection are inductively coupled to balance transient current flowing through the first switch circuit and the second switch circuit when the first and second switch circuits are switched on/off. In an example, the first switch circuit includes a first SiC metal-oxide-semiconductor field effect transistor and the second switch circuit includes a second SiC metal-oxide-semiconductor field effect transistor.

In an embodiment, the first switch circuit is on a first die and the second switch circuit is on a second die. The first die and the second die are assembled in a package face to face.

Aspects of the disclosure provide an apparatus having a power circuit. The power circuit includes a first switch circuit in parallel with a second switch circuit. The first switch circuit and the second switch circuit are coupled to a first driving node, a second driving node, a source node and a drain node via interconnections. The power circuit receives a control signal between the first driving node and the second driving node to control a current flowing from the drain node to the source node through the first switch circuit and the second switch circuit. In the power circuit, a first interconnection and a second interconnection of the interconnections are inductively coupled to balance the current flowing through the first switch circuit and the second switch circuit.

Aspects of the disclosure provide a method that includes disposing a first switch circuit and a second switch circuit in parallel in a power circuit, and coupling the first switch circuit and the second switch circuit to a first driving node, a second driving node, a source node and a drain node of the power circuit via interconnections. The power circuit receives a control signal applied between the first driving node and the second driving node to control a current flowing from the drain node to the source node. Then the method includes inductively coupling a first interconnection and a second interconnection in the interconnections to balance the current flowing through the first switch circuit and the second switch circuit.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
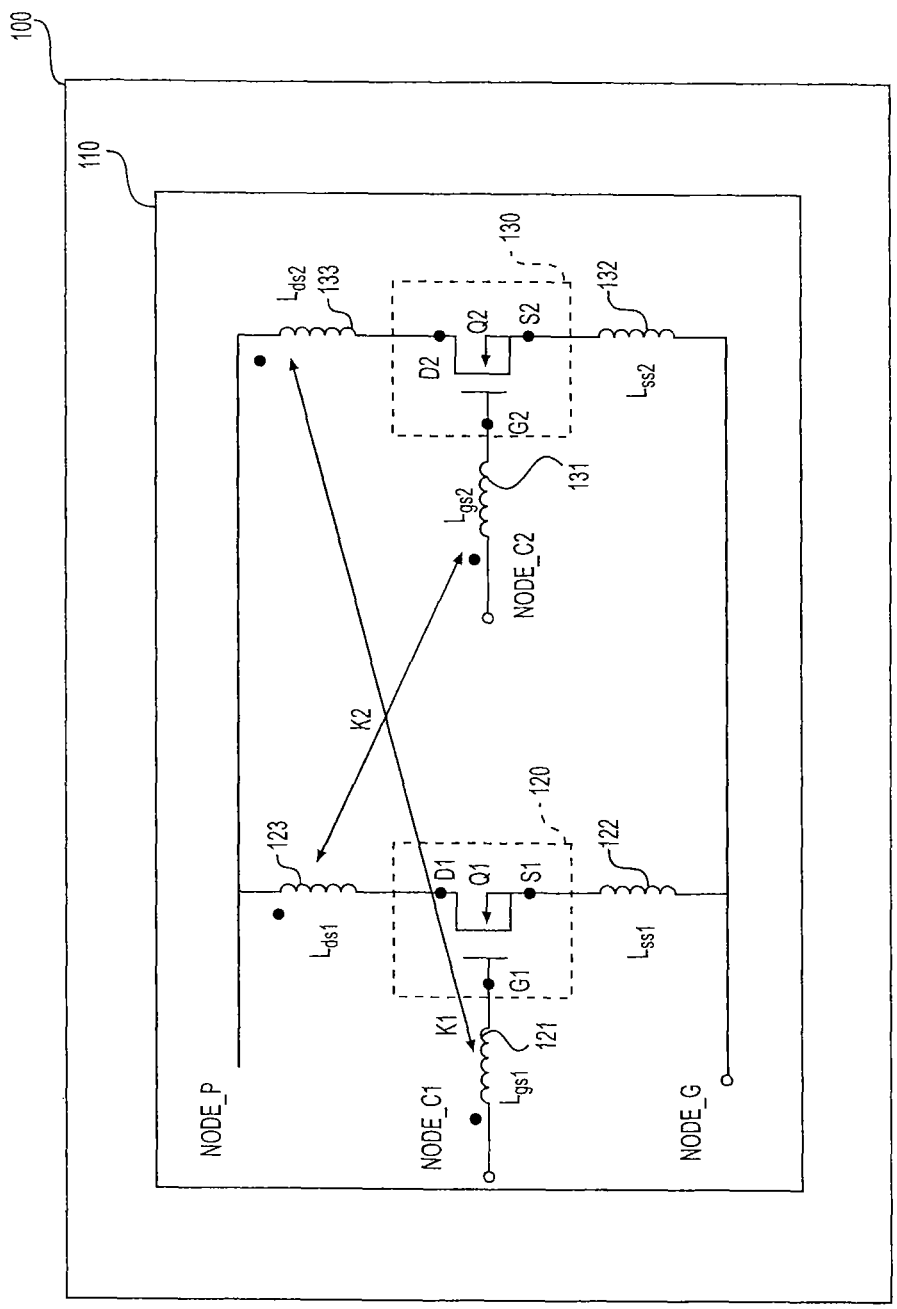
FIG. 1 shows a diagram of a system 100 according to an embodiment of the disclosure.

FIG. 1 shows a diagram of a system 100 according to an embodiment of the disclosure. The system 100 includes a power module 110 that uses mutual inductance coupling to balance current and/or power in parallel components.

The system 100 can be any suitable system that requires a relatively large power, such as a hybrid vehicle, an electric vehicle, a wind energy system, a printing system, and the like. During operation, in an example, the power module 110 needs to provide a relatively large current, such as in the order of Ampere and the like. In an embodiment, the power module 110 is configured to use parallel components to share the relatively large current load.

In an embodiment, the power module 110 includes a power converter circuit, such as a DC-to-AC inverter, an AC-to-DC rectifier, and the like, and is implemented using semiconductor switching devices. The semiconductor switching devices form a plurality of switchable current paths to share the current load. According to an aspect of the disclosure, the semiconductor switching devices may have wide parameter variations, such as threshold voltage (Vth) variations, on-resistance Rds(on) variations, and the like due to manufacturing process. The parameter variations can cause unbalanced current/power on the plurality of switchable current paths. According to an aspect of the disclosure, mutual inductance coupling is used to improve current/power balance among the plurality of switchable current paths.

In the FIG. 1 example, the power module 110 has one or more control nodes NODE_C1-NODE_C2, a first power node NODE_P and a second power node NODE_P. Further, the power module 110 includes a plurality of switch modules, such as a first switch module 120, a second switch module 130 and the like that. The switch modules are coupled in parallel to the control nodes and the power nodes using interconnection components, such as wirebonds, busbars and the like. The switch modules are configured to switch on/off current paths between the first power node NODE_P and the second power node NODE_G based on control signals received at the control nodes NODE_C1-NODE_C2. In an example, the control nodes NODE_C1-NODE_C2 are coupled together to receive a same control signal. In another example, the control nodes NODE_C1-NODE_C2 are separate nodes to receive different control signals.

Each switch module can include one or more transistors. When multiple transistors are used in a switch module, the multiple transistors can be arranged in various topologies to act as a switch.

Specifically, in the FIG. 1 example, the first switch module 120 includes a first transistor Q1, and the second switch module 130 includes a second transistor Q2. The first transistor Q1 and the second transistor Q2 can be any suitable transistors, such as metal-oxide-semiconductor field effect transistors (MOSFET) and the like. In an example, the first transistor Q1 and the second transistor Q2 are SiC MOSFET transistors that may have relatively wide parameter variations due to manufacturing process.

Further, in the FIG. 1 example, the first transistor Q1 has a gate terminal G1, a source terminal S1 and a drain terminal D1. The gate terminal G1 is coupled to the first control node NODE_C1 via an interconnection component 121, the drain terminal D1 is coupled to the first power node NODE_P via an interconnection component 123, and the source terminal S1 is coupled to the second power node NODE_G via an interconnection component 122. Similarly, the second transistor Q2 has a gate terminal G2, a source terminal S2 and a drain terminal D2. The gate terminal G2 is coupled to the first control node NODE_C2 via an interconnection component 131, the drain terminal D2 is coupled to the first power node NODE_P via an interconnection component 133, and the source terminal S2 is coupled to the second power node NODE_G via an interconnection component 132.

According to an aspect of the disclosure, the interconnection components introduce parasitic inductances that influence the switching operation of the power module 110. For example, the interconnection component 121 introduces an inductance $L_{gs1}$, the interconnection component 122 introduces an inductance $L_{ss1}$, the interconnection components 123 introduces an inductance $L_{ds1}$, the interconnection component 131 introduces an inductance $L_{gs2}$, the interconnection component 132 introduces an inductance $L_{ss2}$ and the interconnection component 133 introduces an inductance $L_{ds2}$.

In addition, according to an aspect of the disclosure, the interconnection components are purposely mutual coupled to introduce mutual coupling parasitic inductances to balance current/power among the switch modules in the power module 110. Specifically, in the FIG. 1 example, the interconnection component 121 and the interconnection component 133 are purposely mutually coupled to introduce a mutual coupling parasitic inductance having a mutual coupling coefficient K1; and the interconnection component 123 and the interconnection component 131 are purposely mutually coupled to introduce a mutual coupling parasitic inductance having a mutual coupling coefficient K2.

According to an aspect of the disclosure, the mutual coupling is suitably designed such as the mutual coupling parasitic inductance improves current/power balance among the switch modules. In the FIG. 1 example, when the mutual coupling coefficients K1 and K2 are negative values, the mutual coupling parasitic inductances can improve current/power balance among the switch modules in the power module 110. In an example, at a time to switch on the first transistor Q1 and the second transistor Q2, a first current flowing through the first transistor Q1 (also flowing through the interconnection module 123) increases faster and is larger than a second current flowing through the second transistor Q2. The mutual coupling inductance between the interconnection component 123 and the interconnection component 131 then causes a voltage increase at the gate terminal G2 of the second transistor Q2, and thus turns on the second transistor Q2 more, and increases the second current flowing through the second transistor Q2. When the second current flowing through the second transistor Q2 (also flowing through the interconnection module 133) increases faster and is larger than the first current flowing through the first transistor Q1, the mutual coupling inductance between the interconnection component 133 and the interconnection component 121 causes a voltage increase at the gate terminal G1, and thus turns on the first transistor Q1 more, and increases the first current flowing through the first transistor Q1.

Similarly, at a time to switch off the first transistor Q1 and the second transistor Q2, the transient current flowing through the first transistor Q1 and the second transistor Q2 is balanced due to the mutual inductance coupling.

According to an aspect of the disclosure, when the first transistor Q1 and the second transistor Q2 are SiC MOSFET transistors, the on-resistance Rds(on) of the SiC MOSFET transistor has positive temperature coefficient, and thus the SiC MOSFET transistors intrinsically have negative feedback. Variations of the on-resistance Rds(on) may cause unbalance in the steady-state current, and the negative feedback of the on-resistance Rds(on) self-balances the steady-state current in the first transistor Q1 and the second transistor Q2.

Further, variations in the threshold voltage Vth may cause unbalance in the transient current. The threshold voltage Vth has negative temperature coefficient, and thus can cause a positive feedback and the unbalance in the transient current. The mutual inductance coupling technique can be used to balance the transient current at switching on/off time.

It is noted that the power module 110 can be implemented by various technology. In an example, switch modules, such as the first switch module 120, the second switch module 130, and the like, are implemented as bare dies, and the interconnection modules are implemented as wirebonds and/or busbars. The switch modules, the interconnection modules and other suitable components are assembled in a package to form the power module 110. In another example, the switch modules are discrete devices that are assembled in separate packages, and the switch modules are interconnected by wirebonds and busbars. In another example, the switch modules are integrated on an integrated circuit (IC) chip, and the interconnection modules are implemented as wirebonds on the IC chip using IC manufacturing technology.

Figure 2:
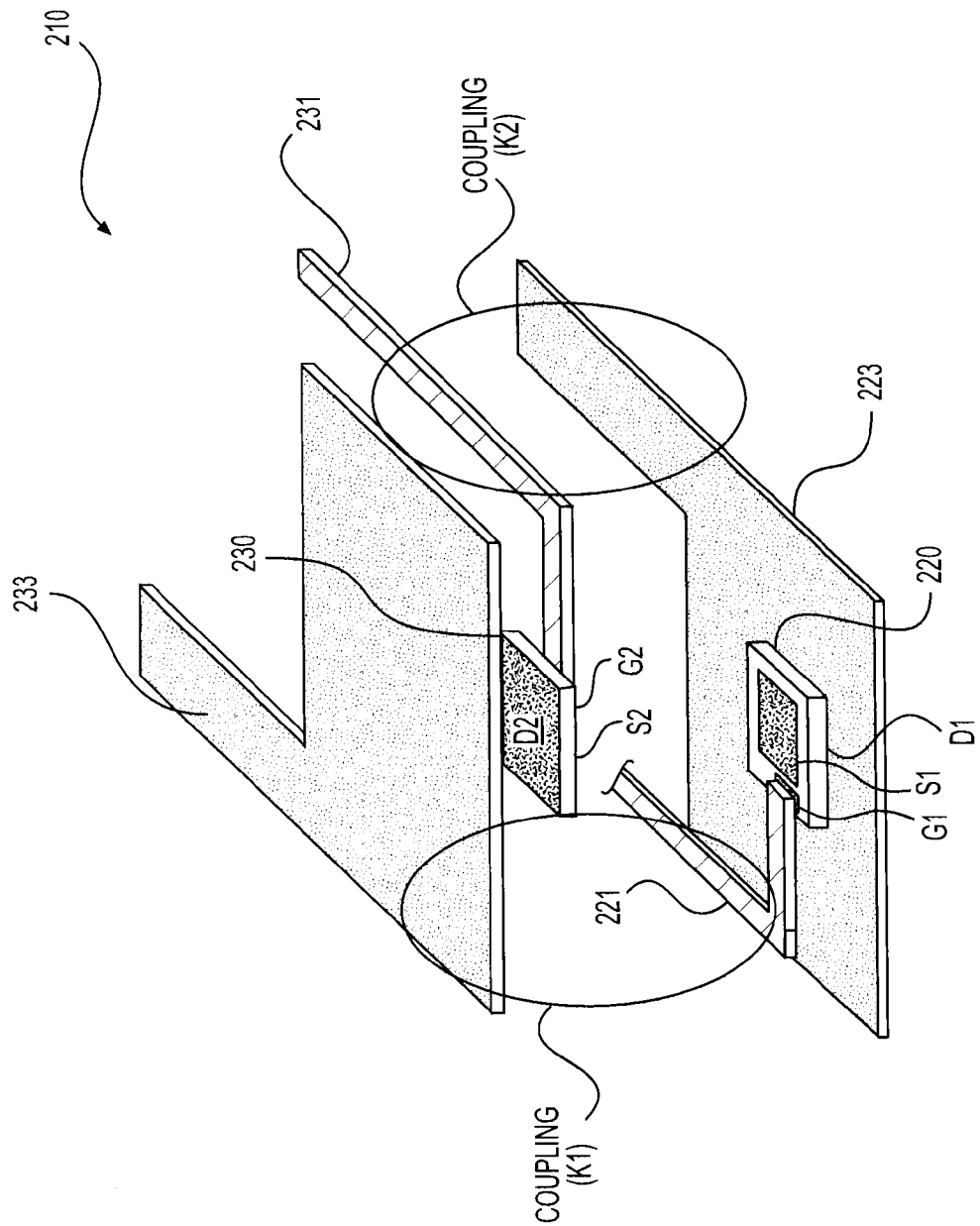
FIG. 2 shows an exploded view in a power module 210 according to an embodiment of the disclosure.

FIG. 2 shows a plot for an exploded view in a power module 210 according to an embodiment of the disclosure. In an embodiment, the power module 110 in FIG. 1 is implemented as the power module 210 in FIG. 2. The power module 210 includes switch modules, such as a first switch module 220, a second switch module 230, and the like that are implemented using bare dies. Further, the power module 210 includes interconnection modules, such as interconnection modules 221, 223, 231, 233 and the like, that are implemented using busbars. The power module 210 is implemented in the form of a package in an example.

For example, the first switch module 220 is a first bare die having a first transistor implemented using a SiC MOSFET technology. Thus, the drain terminal D1 of the first transistor is formed, for example as a bond pad, on the substrate of the first bare die, and the gate terminal G1 and the source terminal S1 of the first transistor are formed, for example as bond pads on the face side (opposite side of the substrate) of the first bare die.

Similarly, the second switch module 230 is a second bare die having a second transistor implemented using the SiC MOSFET technology. Thus, the drain terminal D2 of the second transistor is formed, for example as a bond pad, on the substrate of the second bare die, and the gate terminal G2 and the source terminal S2 of the second transistor are formed, for example as bond pads, on the face side (opposite side of the substrate) of the second bare die.

In an embodiment, the first bare die and the second bare die are disposed face to face. The interconnection module 221 is connected to the gate terminal G1 of the first transistor, the interconnection module 231 is connected to the gate terminal G2 of the second transistor, the interconnection module 223 is connected to the drain terminal D1 of the first transistor, and the interconnection module 231 is connected to the drain terminal D2 of the second transistor.

Further, in the embodiment, the interconnection module 221 and the interconnection module 233 are disposed to have a mutual coupling parasitic inductance having a mutual coupling coefficient K1. For example, the interconnection module 221 and the interconnection module 233 are disposed nearby, such that a current change in one of the interconnection modules can induce a voltage on the other interconnection module. In addition, the interconnection module 231 and the interconnection module 223 are disposed to have a mutual coupling parasitic inductance having a mutual coupling coefficient K2. For example, the interconnection module 223 and the interconnection module 231 are disposed nearby, such that a current change in one of the interconnection modules can induce a voltage in the other interconnection module. In an example, the mutual coupling parasitic inductance is suitably designed to improve transient current/power balance at the time of switching on/off the first and second transistors.

It is noted that, for ease and simplicity, the power module 210 includes other suitable components that are not shown in FIG. 2. For example, the source terminals S1 and S2 are connected by a suitable interconnection module not shown, such as a wirebond, a busbar and the like. It is also noted that, the configuration of the dies and the busbars in FIG. 2 can be suitably modified. For example, the two dies can be disposed in a back to back manner in an example, or can be disposed side by side in an example.

Figure 3:
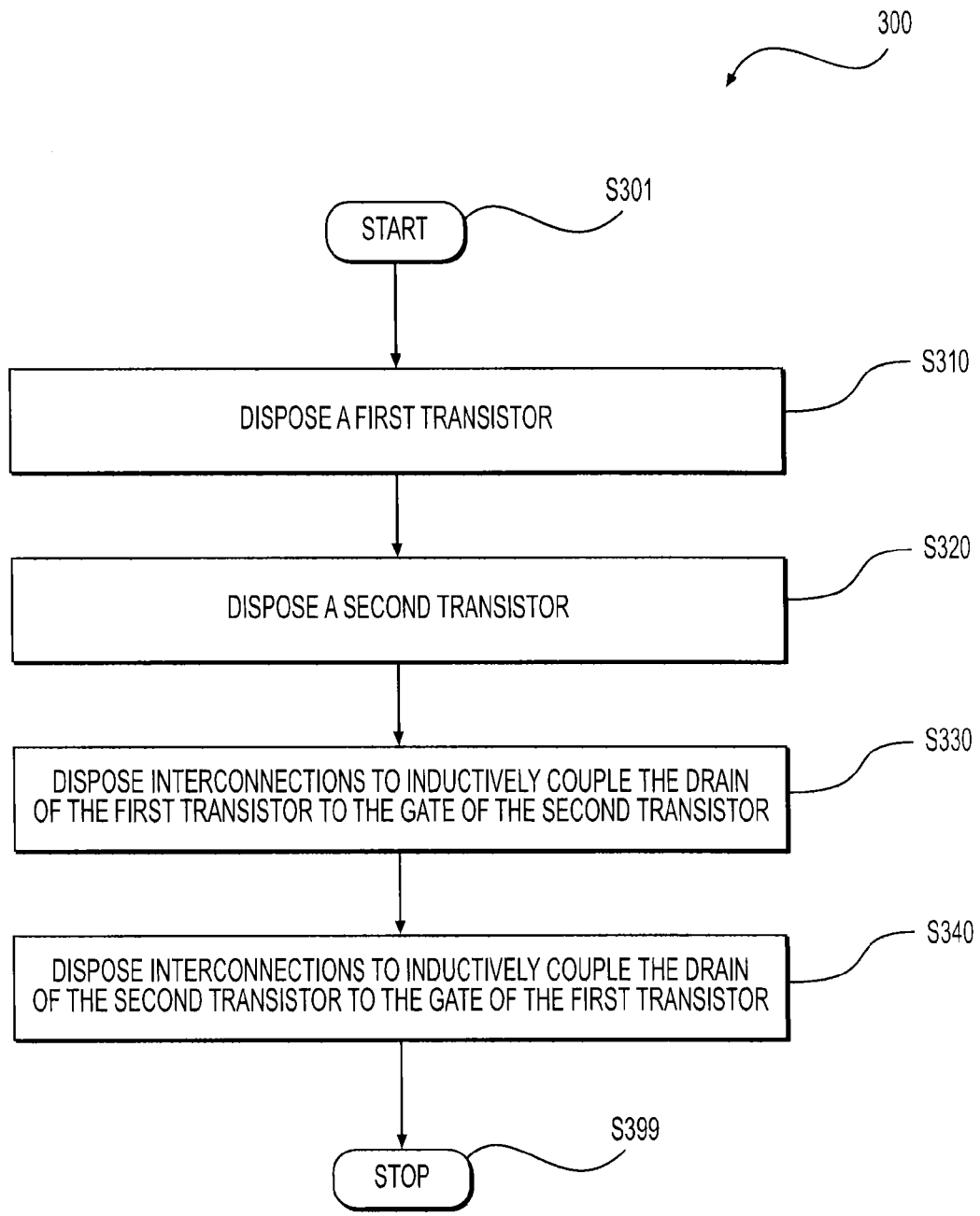
FIG. 3 shows a flow chart outlining a process example according to an embodiment of the disclosure.

FIG. 3 shows a flow chart outlining a process 300 according to an embodiment of the disclosure. In an example, the process 300 is executed to implement the power module 210. The process starts at S301, and proceeds to S310.

At S310, a first transistor is disposed. For example, the first transistor is implemented on a first bare die using the SiC MOSFET technology.

At S320, a second transistor is disposed. For example, the second transistor is implemented on a second bare die using the SiC MOSFET technology.

At S330, interconnections are disposed to inductively couple the drain terminal of the first transistor to the gate terminal of the second transistor. In the FIG. 2 example, the interconnection module 223 connects with the drain terminal of the first transistor, and the interconnection module 231 connects with the gate terminal of the second transistor. The interconnection module 223 and the interconnection module 231 are disposed, for example nearby, to be inductively coupled.

At S340, interconnections are disposed to inductively couple the drain terminal of the second transistor to the gate terminal of the first transistor. In the FIG. 2 example, the interconnection 233 module connects with the drain terminal of the second transistor, and the interconnection module 221 connects with the gate terminal of the first transistor. The interconnection module 233 and the interconnection module 221 are disposed, for example nearby, to be inductively coupled. Then the process proceeds to S399 and terminates.

It is noted that the process 300 can include other suitable steps to implement a power module. Further, the steps in the process 300 can be executed at the same time or in a different order.

Figure 4:
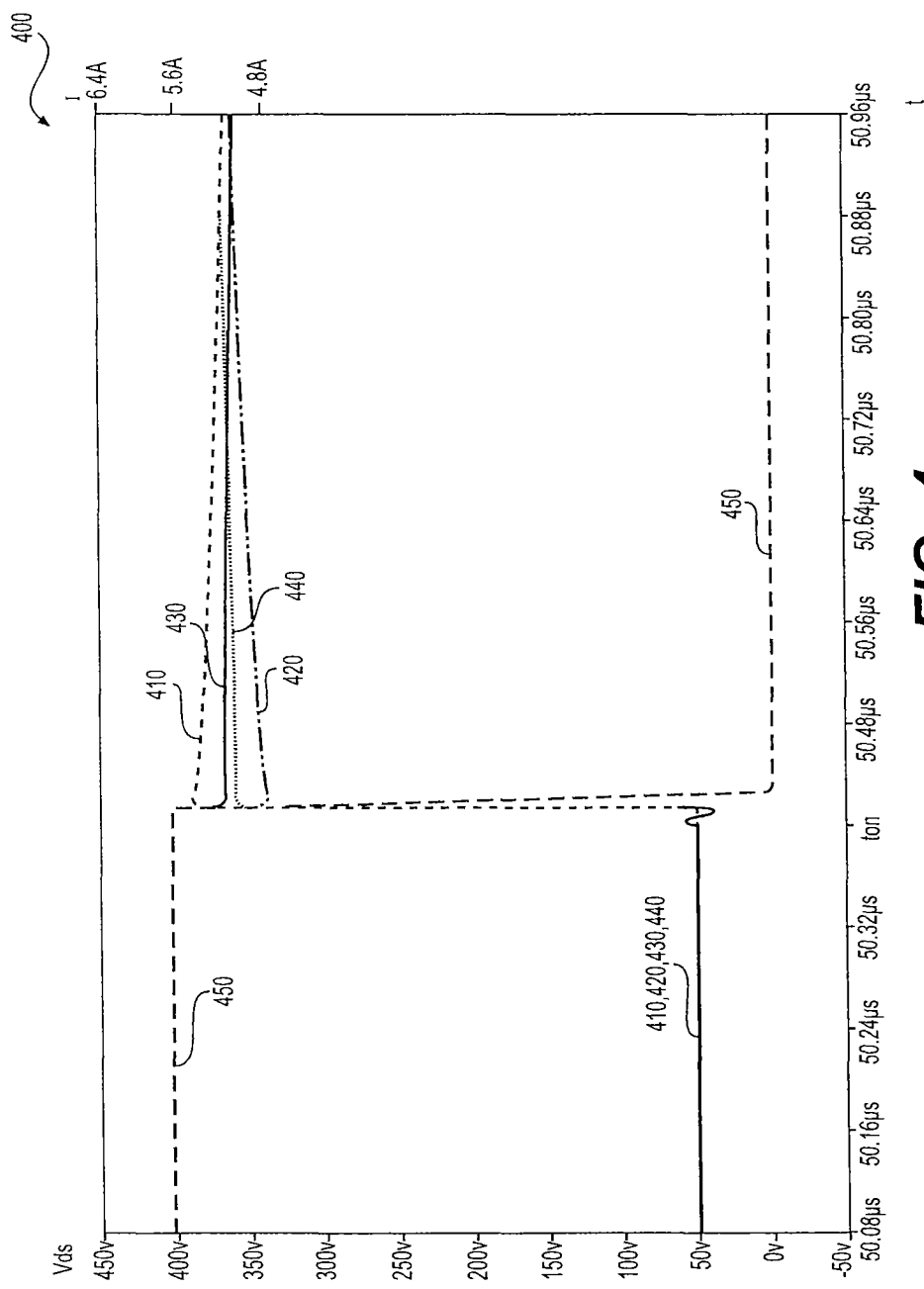
FIGS. 4 and 5 show plots of simulation results according to an embodiment of the disclosure.

FIG. 4 shows a plot 400 of simulation result according to an embodiment of the disclosure. For example, the plot 400 shows voltage and current changes with or without mutual coupling parasitic inductance when a power module with parallel transistors is switched on. The X-axis shows time, and the Y-axis shows voltage and current values.

The plot 400 includes five waveforms 410-450. The waveform 410 (in medium dashed line) shows drain current of the first transistor without mutual coupling parasitic inductance, the waveform 420 (in long-short dashed line) shows drain current of the second transistor without mutual coupling parasitic inductance, the waveform 430 (in solid line) shows drain current of the first transistor with mutual coupling parasitic inductance, the waveform 440 (in short dashed line) shows drain current of the second transistor with mutual coupling parasitic inductance, and the waveform 450 (in long dashed line) shows the drain-source voltage Vds.

As shown in FIG. 4, at time ton, the first transistor and the second transistor are switched on. Without mutual coupling parasitic inductance, the transient current in the first transistor and the transient current in the second transistor have relatively large difference. With mutual coupling parasitic inductance, the transient current difference in the first transistor and the second transistor is reduced.

Figure 5:
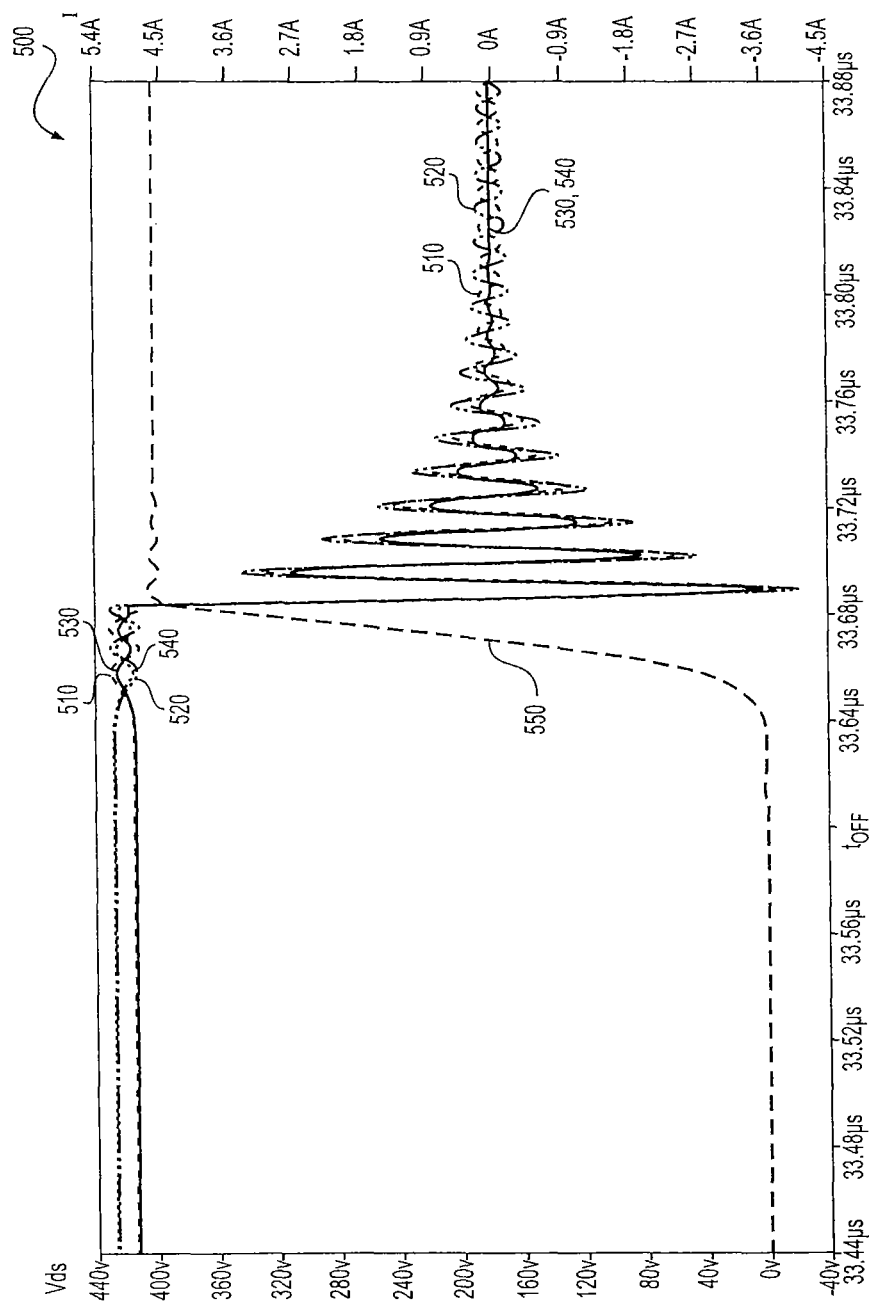

FIG. 5 shows a plot 500 of simulation result according to an embodiment of the disclosure. For example, the plot 500 shows voltage and current changes with or without mutual coupling parasitic inductance when a power module with parallel transistors is switched off. The X-axis shows time, and the Y-axis shows voltage and current values.

The plot 500 includes five waveforms 510-550. The waveform 510 (in medium dashed line) shows drain current of the first transistor without mutual coupling parasitic inductance, the waveform 520 (in long-short dashed line) shows drain current of the second transistor without mutual coupling parasitic inductance, the waveform 530 (in solid line) shows drain current of the first transistor with mutual coupling parasitic inductance, the waveform 540 (in short dashed line) shows drain current of the second transistor with mutual coupling parasitic inductance, and the waveform 550 (in long dashed line) shows the drain-source voltage Vds.

As shown in FIG. 5, at time toff, the first transistor and the second transistor are switched off. Without mutual coupling parasitic inductance, the transient current in the first transistor and the transient current in the second transistor have relatively large difference as shown by the waveforms 510 and 520. With mutual coupling parasitic inductance, the transient current difference in the first transistor and the second transistor is reduced as shown by the waveforms 530 and 540.

Figure 6:
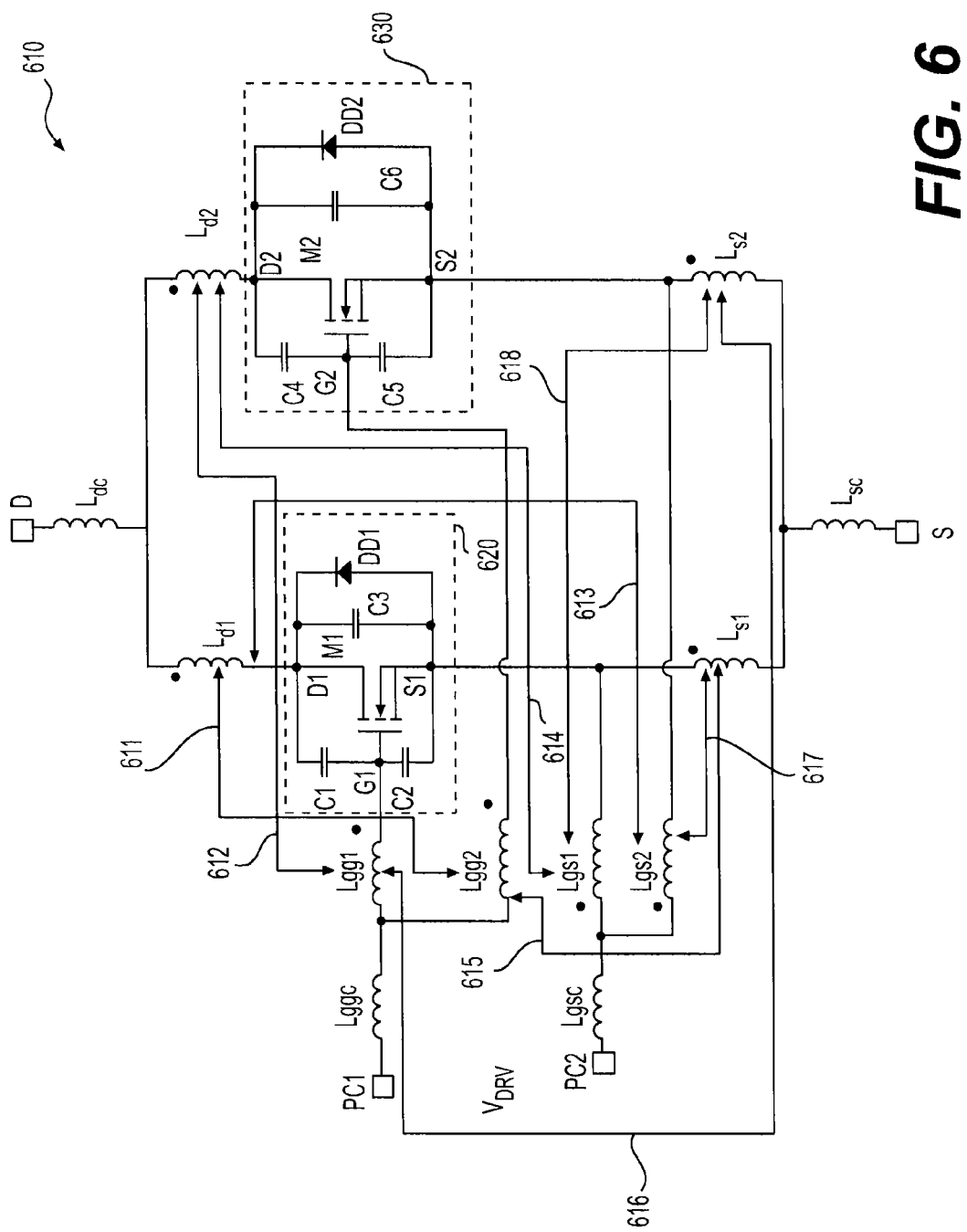
FIG. 6 shows a diagram of a power module 610 according to an embodiment of the disclosure.

FIG. 6 shows a circuit diagram of a power module 610 for simulation according to an embodiment of the disclosure. The power module 610 operates similarly to the power module 110 described above, and also utilizes certain components that are identical or equivalent to those used in the power module 110; the description of these components has been provided above and will be omitted here for clarity purposes.

In the FIG. 6 example, the power module 610 includes two driving nodes PC1 and PC2 to receive a control signal $V_{DRV}$. Further, the power module 610 includes a drain node D and a source node S. In an example, the drain node D and the source node S are connected to a power source. The power module 610 conducts a current flowing from the drain node D to the source node S in response to the control signal $V_{DRV}$.

According to an aspect of the disclosure, the power module 610 includes a plurality of switch modules, such as a first switch module 620, a second switch module 630 and the like. The switch modules are in parallel coupled to the driving nodes PC1 and PC2, the drain node D and the source node S using interconnection components, such as wire-bonds, busbars and the like. The switch modules are configured to switch on/off current paths between the drain node D and the source node S based on the control signal $V_{DRV}$ received at the driving nodes PC1 and PC2.

Each switch module can include one or more transistors. When multiple transistors are used in a switch module, the multiple transistors can be arranged in various topologies to act as a switch.

Specifically, in the FIG. 6 example, the first switch module 620 includes a first transistor, and the second switch module 630 includes a second transistor. The first transistor and the second transistor can be any suitable transistors, such as metal-oxide-semiconductor field effect transistors (MOSFET) and the like. In an example, the first transistor and the second transistor are SiC MOSFET transistors that may have relatively wide parameter variations due to manufacturing process.

It is noted that real transistors can possess various parasitic elements, and are generally modeled using equivalent circuits in simulation. In the FIG. 6 example, the first transistor has a gate terminal G1, a source terminal S1 and a drain terminal D1, and is modeled using a transistor model M1, capacitors C1-C3, and a diode DD1 coupled together as shown in FIG. 6. Similarly, the second transistor has a gate terminal G2, a source terminal S2 and a drain terminal D2, and is modeled using a transistor model M2, capacitors C4-C6 and a diode DD2 coupled together as shown in FIG. 6.

According to an aspect of the disclosure, the terminals of the first transistor and the second transistors are coupled to the driving nodes PC1-PC2, the drain node D, and the source node S by interconnection components, and the interconnection components introduce parasitic inductances that influence the switching operation of the power module 610. The interconnection components can be modeled using inductances. For example, in the FIG. 6 example, the interconnection components between the driving node PC1 and the gate terminals G1 and G2 are modeled using inductances $L_{ggc}$, $L_{gg1}$, and $L_{gg2}$ coupled together as shown in FIG. 6; the interconnection components between the driving node PC2 and the source terminals S1 and S2 are modeled using inductances $L_{gsc}$, $L_{gs1}$, and $L_{gs2}$ coupled together as shown in FIG. 6; the interconnection components between the source node S and the source terminals S1 and S2 are modeled using inductances $L_{sc}$, $L_{s1}$, and $L_{s2}$ coupled together as shown in FIG. 6; the interconnection components between the drain node D and the drain terminals D1 and D2 are modeled using inductances $L_{dc}$, $L_{d1}$, and $L_{d2}$ coupled together as shown in FIG. 6.

According to an aspect of the disclosure, the interconnection components can be purposely mutual coupled to introduce mutual coupling parasitic inductances to balance current/power among the switch modules in a power module. According to an aspect of the disclosure, parasitic inductances can be in a directly coupled state or an inverse coupled state. When the parasitic inductances are in the directly coupled state, cross coupling techniques can be used to reduce current/power unbalance, and when the parasitic inductances are in the inversely coupled state, self-coupling techniques can be used to reduce current/power unbalance.

In the FIG. 6 example, the direction of the drain inductance (e.g., the direction of $L_{d2}$ and $L_{d2}$) and the direction of the gate inductance (e.g., the direction of $L_{gg1}$ and $L_{gg2}$) of transistors make the drain inductance and the gate inductance in the directly coupled state (assuming positive mutual coupling coefficient). In the directly coupled state, when the drain current increases, the coupling of the drain inductance and the gate inductance can cause an increase in the gate voltage. In order to have a negative feedback to reduce the current/power unbalance for the directly coupled state, the drain inductance $L_{d1}$ of the first switch module 620 is cross coupled to the gate inductance $L_{gg2}$ of the second switch module 630 with a first mutual coupling coefficient, and the drain inductance $L_{d2}$ of the second switch module 630 is cross coupled to the gate inductance $L_{gg1}$ of the first switch module 620 with a second mutual coupling coefficient. In the example, positive mutual coupling coefficients are used. Further, in an example, with higher mutual coupling coefficients (e.g., 0.9), the difference between the different current paths is smaller, the switching speed is faster, but the transistors may have higher current overshoot peak.

According to an aspect of the disclosure, four cross coupling techniques (drain-gate cross coupling, drain-Kelvin gate cross coupling, source-gate cross coupling, and source-Kelvin gate cross coupling) can be used to introduce mutual coupling parasitic inductances between parallel switch modules.

For example, for the drain-gate cross coupling, the interconnection component modeled by the drain inductance $L_{d1}$ of the first switch module 620 and the interconnection component modeled by the gate inductance $L_{gg2}$ of the second switch module 630 are purposely mutually coupled to introduce a mutual coupling parasitic inductance as shown by 611, and the interconnection component modeled by the drain inductance $L_{d2}$ of the second switch module 630 and the interconnection component modeled by the gate inductance $L_{gg1}$ of the first switch module 620 are purposely mutually coupled to introduce a mutual coupling parasitic inductance as shown by 612.

For the drain-Kelvin gate cross coupling, the interconnection component modeled by the drain inductance $L_{d1}$ of the first switch module 620 and the interconnection component modeled by the Kelvin gate inductance $L_{gs2}$ of the second switch module 630 are purposely mutually coupled to introduce a mutual coupling parasitic inductance as shown by 613, and the interconnection component modeled by the drain inductance $L_{d2}$ of the second switch module 630 and the interconnection component modeled by the Kelvin gate inductance $L_{gs1}$ of the first switch module 620 are purposely mutually coupled to introduce a mutual coupling parasitic inductance as shown by 614.

For the source-gate cross coupling, the interconnection component modeled by the source inductance $L_{s1}$ of the first switch module 620 and the interconnection component modeled by the gate inductance $L_{gg2}$ of the second switch module 630 are purposely mutually coupled to introduce a mutual coupling parasitic inductance as shown by 615, and the interconnection component modeled by the source inductance $L_{s2}$ of the second switch module 630 and the interconnection component modeled by the gate inductance $L_{gg1}$ of the first switch module 620 are purposely mutually coupled to introduce a mutual coupling parasitic inductance as shown by 616.

For the source-Kelvin gate cross coupling, the interconnection component modeled by the drain inductance $L_{s1}$ of the first switch module 620 and the interconnection component modeled by the Kelvin gate inductance $L_{gs2}$ of the second switch module 630 are purposely mutually coupled to introduce a mutual coupling parasitic inductance as shown by 617, and the interconnection component modeled by the source inductance $L_{s2}$ of the second switch module 630 and the interconnection component modeled by the Kelvin gate inductance $L_{gs1}$ of the first switch module 620 are purposely mutually coupled to introduce a mutual coupling parasitic inductance as shown by 618.

Figure 7:
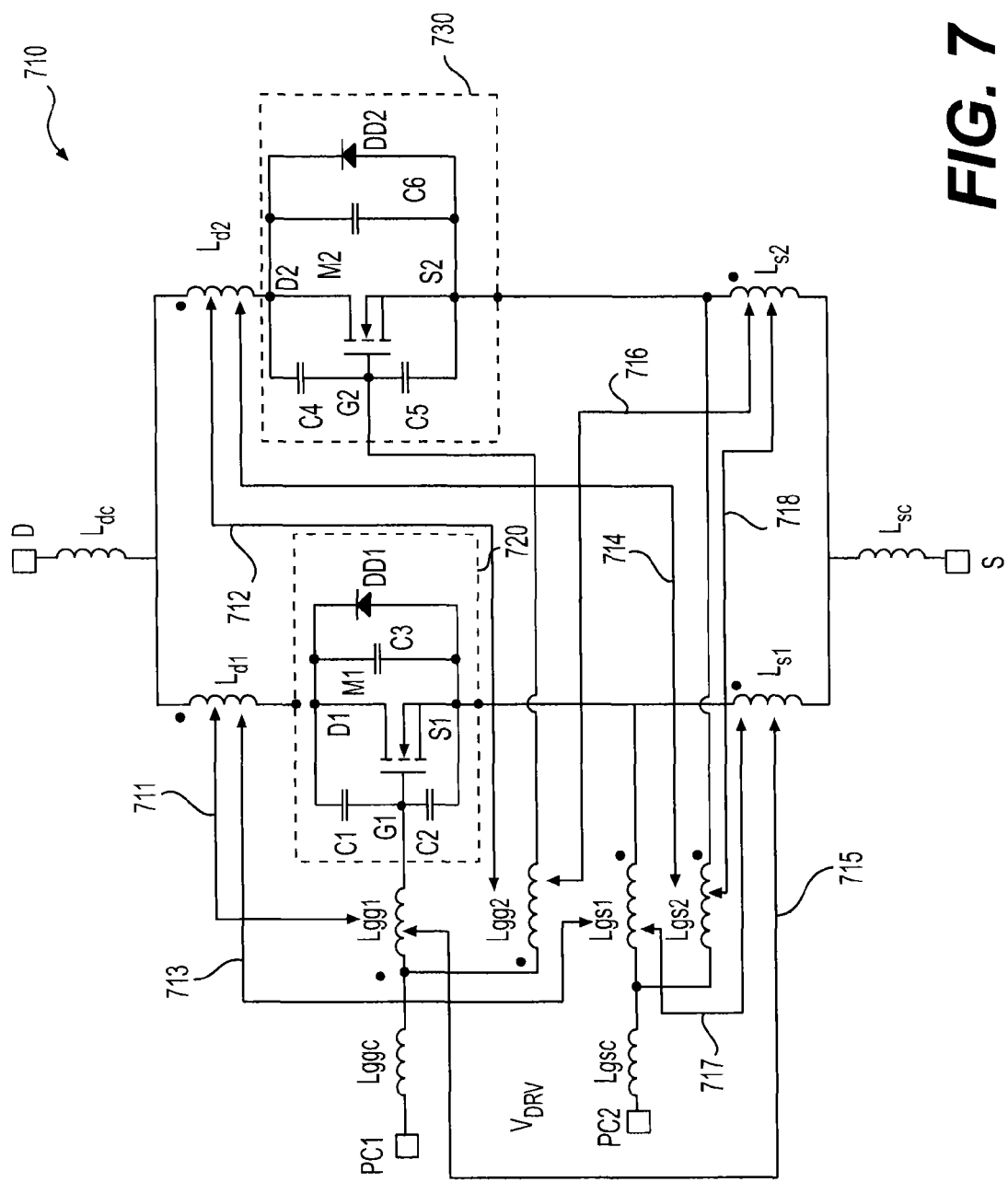
FIG. 7 shows a diagram of a power module 710 according to an embodiment of the disclosure.

FIG. 7 shows a diagram of a power module 710 for circuit simulation according to an embodiment of the disclosure. The power module 710 operates similarly to the power module 610 described above, and also utilizes certain components that are identical or equivalent to those used in the power module 610; the description of these components has been provided above and will be omitted here for clarity purposes.

In the FIG. 7 example, the direction of the drain inductance (e.g., the direction of $L_{d2}$ and $L_{d2}$) and the direction of the gate inductance (e.g., the direction of $L_{gg1}$ and $L_{gg2}$) are configured in the inversely coupled state (assuming positive mutual coupling coefficient). In the inversely coupled state, when the drain current increases, the coupling of the drain inductance and the gate inductance can cause a decrease in the gate voltage. In order to have a negative feedback to reduce the current unbalance for the inversely coupled state, self-coupling techniques can be used. For example, the drain inductance $L_{d1}$ of the first switch module 720 is self-coupled to the gate inductance $L_{gg1}$ of the first switch module 720, and the drain inductance $L_{d2}$ of the second switch module 730 is self-coupled to the gate inductance $L_{gg2}$ of the second switch module 730 with positive mutual coupling coefficients to reduce power/current unbalance.

According to an aspect of the disclosure, four self-coupling techniques (drain-gate self-coupling, drain-Kelvin gate self-coupling, source-gate self-coupling, and source- Kelvin gate self-coupling) can be used to introduce mutual coupling parasitic inductances within each switch module.

For example, for the drain-gate self-coupling, the interconnection component modeled by the drain inductance $L_{d1}$ of the first switch module 720 and the interconnection component modeled by the gate inductance $L_{gg1}$ of the first switch module 720 are purposely mutually coupled to introduce a mutual coupling parasitic inductance as shown by 711, and the interconnection component modeled by the drain inductance $L_{d2}$ of the second switch module 730 and the interconnection component modeled by the gate inductance $L_{gg2}$ of the second switch module 730 are purposely mutually coupled to introduce a mutual coupling parasitic inductance as shown by 712.

For the drain-Kelvin gate self-coupling, the interconnection component modeled by the drain inductance $L_{d1}$ of the first switch module 720 and the interconnection component modeled by the Kelvin gate inductance $L_{gs1}$ of the first switch module 720 are purposely mutually coupled to introduce a mutual coupling parasitic inductance as shown by 713, and the interconnection component modeled by the drain inductance $L_{d2}$ of the second switch module 730 and the interconnection component modeled by the Kelvin gate inductance $L_{gs2}$ of the second switch module 730 are purposely mutually coupled to introduce a mutual coupling parasitic inductance as shown by 714.

For the source-gate self-coupling, the interconnection component modeled by the source inductance $L_{s1}$ of the first switch module 720 and the interconnection component modeled by the gate inductance $L_{gg1}$ of the first switch module 720 are purposely mutually coupled to introduce a mutual coupling parasitic inductance as shown by 715, and the interconnection component modeled by the source inductance $L_{s2}$ of the second switch module 730 and the interconnection component modeled by the gate inductance $L_{gg2}$ of the second switch module 730 are purposely mutually coupled to introduce a mutual coupling parasitic inductance as shown by 716.

For the source-Kelvin gate self-coupling, the interconnection component modeled by the drain inductance $L_{s1}$ of the first switch module 720 and the interconnection component modeled by the Kelvin gate inductance $L_{gs1}$ of the first switch module 730 are purposely mutually coupled to introduce a mutual coupling parasitic inductance as shown by 717, and the interconnection component modeled by the source inductance $L_{s2}$ of the second switch module 730 and the interconnection component modeled by the Kelvin gate inductance $L_{gs2}$ of the second switch module 720 are purposely mutually coupled to introduce a mutual coupling parasitic inductance as shown by 718.

Figure 8A:
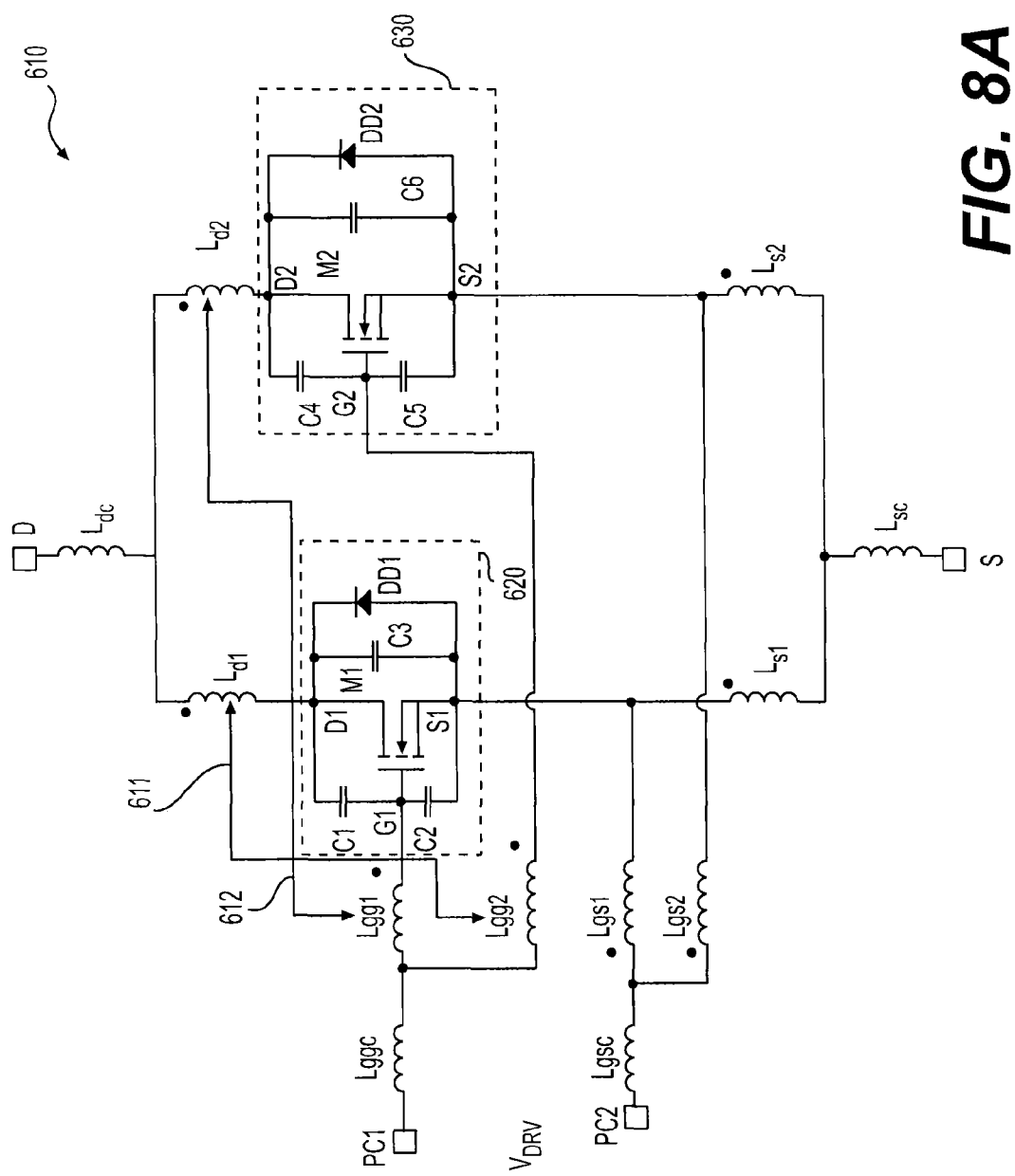
FIG. 8A shows a diagram of the power module 610 for a simulation.

FIG. 8A shows a diagram of the power module 610 for a simulation. In the FIG. 8A example, the power module 610 is in a directly coupled state that uses a cross coupling technique to improve current balance according to an embodiment of the disclosure.

Figure 8B:
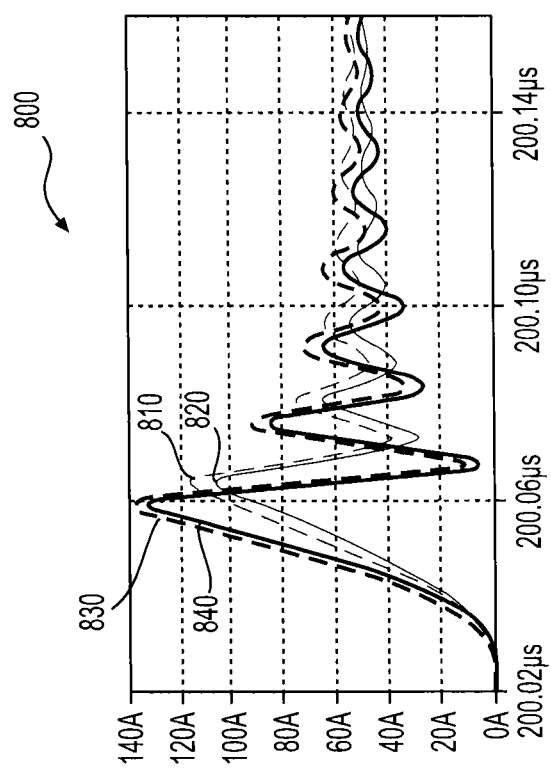
FIG. 8B shows a plot of simulation results for the power module 610 in FIG. 8A.

FIG. 8B shows a plot of simulation result for the power module 610 in FIG. 8A. In the power module 610 of FIG. 8A, the direction of the drain inductance (e.g., the direction of $L_{d2}$ and $L_{d2}$) and the direction of the gate inductance (e.g., the direction of $L_{gg1}$ and $L_{gg2}$) are configured in the directly coupled state. With the directly coupled state, cross-coupling techniques, such as the drain-gate cross coupling technique as shown by 611 and 612, are used to reduce current unbalance.

In FIG. 8B, the X-axis shows time and the Y-axis shows drain current for switch modules. The plot 800 compares the drain current during switching for a first simulation using a first mutual coupling coefficient of zero (without using cross coupling technique) and a second simulation using a second mutual coupling coefficient of 0.9 (using a cross coupling technique). The plot 800 includes a first curve 810 and a second current 820 of drain current for the first simulation without using cross-coupling technique, and a third curve 830 and a fourth curve 840 of drain current for the second simulation that uses cross coupling technique.

As seen in FIG. 8B, the drain current difference between the third curve 830 and the fourth curve 840 is relatively smaller than the drain current difference between the first curve 810 and the second curve 820. Thus, the cross-coupling technique for the directly coupled state reduces current unbalance. Also seen in FIG. 8B, with the cross coupling technique, the switching current is larger, the switching speed is faster, and the current overshoot peak is higher.

Figure 9A:
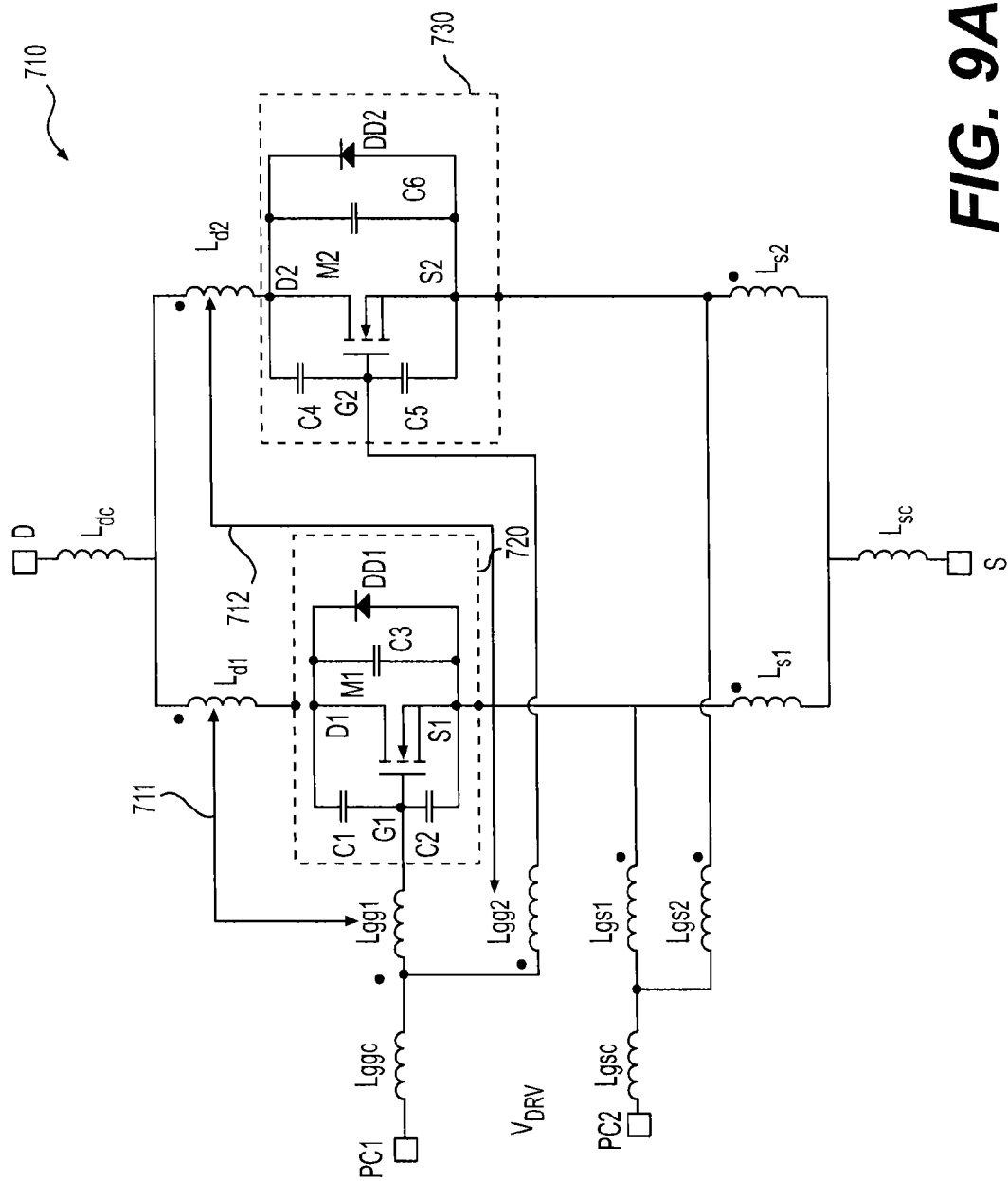
FIG. 9A shows a diagram of the power module 710 for a simulation.

FIG. 9A shows a diagram of the power module 710 for a simulation. In the FIG. 9A example, the power module 710 is in an inversely coupled state that uses a self-coupling technique to improve current balance according to an embodiment of the disclosure.

Figure 9B:
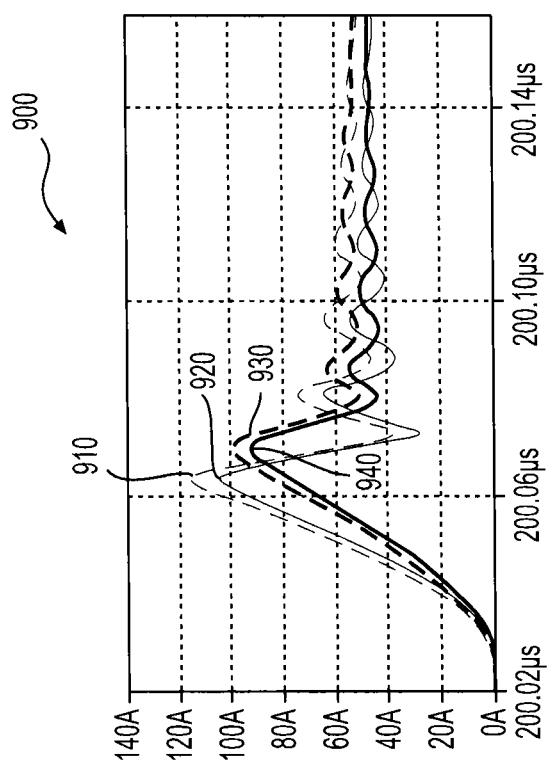
FIG. 9B shows a plot of simulation results for the power module 710 in FIG. 9A.

FIG. 9B shows a plot of simulation result for the power module 710 in FIG. 9A. In the FIG. 9A example, the direction of the drain inductance (e.g., the direction of $L_{d2}$ and $L_{d2}$) and the direction of the gate inductance (e.g., the direction of $L_{gg1}$ and $L_{gg2}$) are configured in the inversely coupled state. With the inversely coupled state, self-coupling techniques, such as the drain-gate self-coupling technique as shown by 711 and 712, are used to reduce current unbalance.

In FIG. 9B, the X-axis shows time and the Y-axis shows drain current for switch modules. The plot 900 compares the drain current during switching for a first simulation using a first mutual coupling coefficient of zero (without using self-coupling technique) and a second simulation using a second mutual coupling coefficient of 0.9 (using a self-coupling technique). The plot 900 includes a first curve 910 and a second current 920 of drain current for the first simulation without using self-coupling technique, and a third curve 930 and a fourth curve 940 of drain current for the second simulation that uses self-coupling technique.

As seen in FIG. 9B, the drain current difference between the third curve 930 and the fourth curve 940 is relatively smaller than the drain current difference between the first curve 910 and the second curve 920. Thus, the self-coupling techniques for the inversely coupled state can reduce current unbalance. Also seen in FIG. 9B, with the self-coupling technique, the switching current is smaller, the switching speed is slower, and the current overshoot peak is lower.

According to an aspect of the disclosure, the cross-coupling techniques for the directly coupled state and the self-coupling techniques for the inversely coupled state can be suitably combined to improve current balance.

Figure 10:
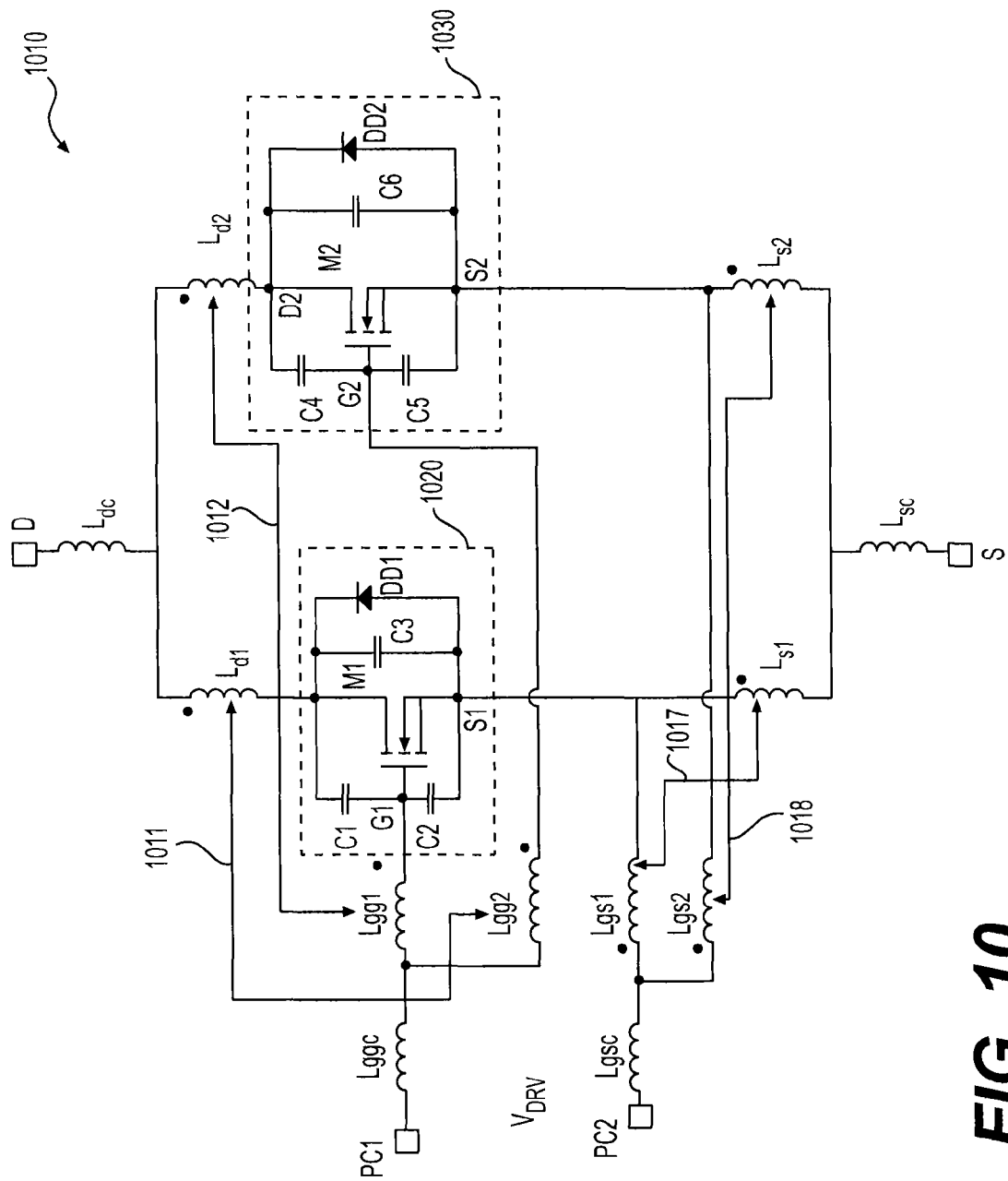
FIG. 10 shows a diagram of a power module 1010 according to an embodiment of the disclosure.

FIG. 10 shows a diagram of a power module 1010 for circuit simulation according to an embodiment of the disclosure. The power module 1010 operates similarly to the power module 610 and the power module 710 described above, and also utilizes certain components that are identical or equivalent to those used in the power module 610 and the power module 710; the description of these components has been provided above and will be omitted here for clarity purposes. In the power module 1010, the drain inductance and the gate inductance are in the directly coupled state while the source inductance and the Kelvin gate inductance are in the inversely coupled state.

In the FIG. 10 example, the interconnection component modeled by the drain inductance $L_{d1}$ of the first switch module 1020 and the interconnection component modeled by the gate inductance $L_{gg2}$ of the second switch module 1030 are purposely mutually coupled to introduce a mutual coupling parasitic inductance as shown by 1011, and the interconnection component modeled by the drain inductance $L_{d2}$ of the second switch module 1030 and the interconnection component modeled by the gate inductance $L_{gg1}$ of the first switch module 1020 are purposely mutually coupled to introduce a mutual coupling parasitic inductance as shown by 1012.

Further, in the FIG. 10 example, the interconnection component modeled by the drain inductance $L_{s1}$ of the first switch module 1020 and the interconnection component modeled by the Kelvin gate inductance $L_{gs1}$ of the first switch module 1030 are purposely mutually coupled to introduce a mutual coupling parasitic inductance as shown by 1017, and the interconnection component modeled by the source inductance $L_{s2}$ of the second switch module 1030 and the interconnection component modeled by the Kelvin gate inductance $L_{gs2}$ of the second switch module 1020 are purposely mutually coupled to introduce a mutual coupling parasitic inductance as shown by 1018.

Figure 11B:
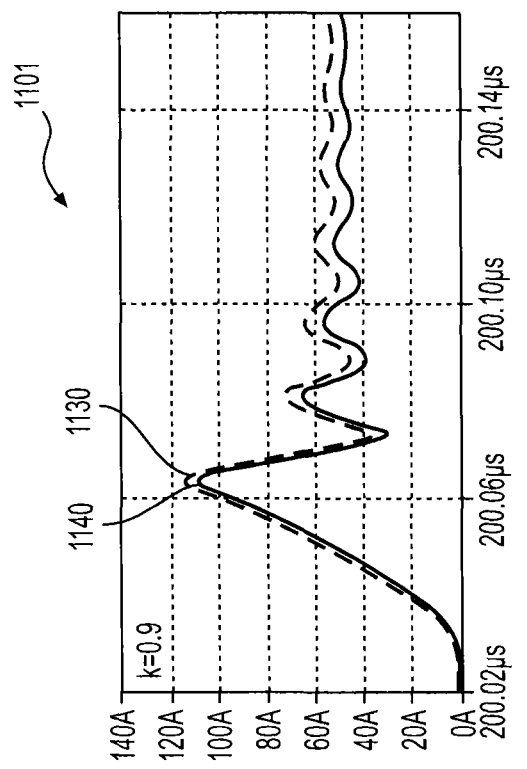
FIGS. 11A-11B show plots of simulation results according to an embodiment of the disclosure.
Figure 11A:
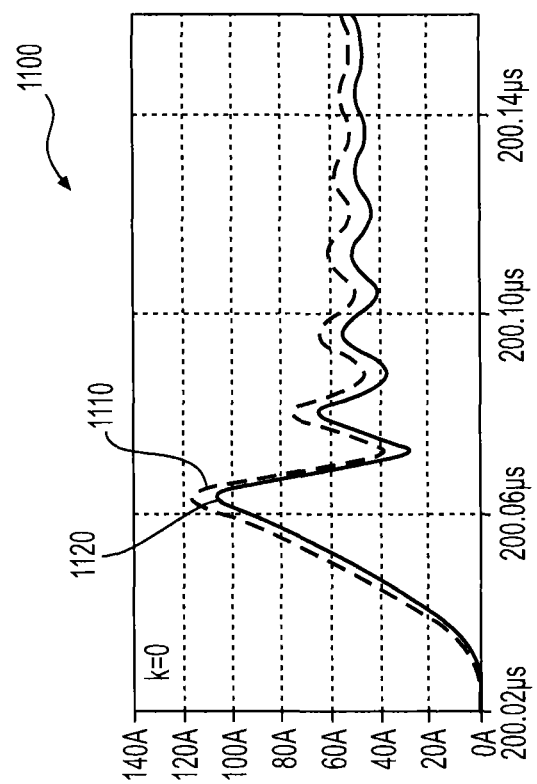

FIGS. 11A-11B show simulation result for the power module 1010 according to an embodiment of the disclosure. FIG. 11A shows drain current during switching for a first simulation using a first mutual coupling coefficient of zero (without using any of the cross coupling technique and self-coupling technique) and FIG. 11B shows the drain current during switching for a second simulation using a second mutual coupling coefficient of 0.9 (for both cross coupling and self-coupling techniques).

As seen in FIGS. 11A and 11B, the switching speed and peak current are about the same for the first simulation and the second simulation; however, the current unbalance is significantly reduced, specifically in the first few oscillation cycles.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A power circuit, comprising:
a first switch circuit in parallel with a second switch circuit, the first switch circuit and the second switch circuit being coupled to a first driving node, a second driving node, a source node and a drain node via interconnections, the power circuit receiving a control signal between the first driving node and the second driving node to control a current flowing from the drain node to the source node through the first switch circuit and the second switch circuit, wherein a first interconnection and a second interconnection of the interconnections are inductively coupled to balance the current flowing through the first switch circuit and the second switch circuit.

2. The power circuit of claim 1, wherein the first interconnection is among first interconnections that interconnect the first switch circuit to the first driving node, the second driving node, the source node and the drain node, and the second interconnection is among second interconnections that interconnect the second switch circuit to the first driving node, the second driving node, the source node and the drain node.

3. The power circuit of claim 2, wherein the first interconnections have a corresponding third interconnection to the second interconnection, and parasitic inductances introduced by the first interconnection and the third interconnection are in a directly coupled state.

4. The power circuit of claim 3, wherein the second interconnections have a corresponding fourth interconnection to the first interconnection, the third interconnection and the fourth interconnection are inductively coupled.

5. The power circuit of claim 3, wherein the first interconnection interconnects a gate terminal of the first switch circuit to the first driving node, and the second interconnection interconnects a drain terminal of the second switch circuit to the drain node.

6. The power circuit of claim 3, wherein the first interconnection interconnects a gate terminal of the first switch circuit to the first driving node, and the second interconnection interconnects a source terminal of the second switch circuit to the source node.

7. The power circuit of claim 3, wherein the first interconnection interconnects a source terminal of the first switch circuit to the second driving node, and the second interconnection interconnects a drain terminal of the second switch circuit to the drain node.

8. The power circuit of claim 3, wherein the first interconnection interconnects a source terminal of the first switch circuit to the second driving node, and the second interconnection interconnects a source terminal of the second switch circuit to the source node.

9. The power circuit of claim 1, wherein the first interconnection and the second interconnection are among interconnections that interconnect the first switch circuit to the first driving node, the second driving node, the source node and the drain node.

10. The power circuit of claim 9, wherein parasitic inductances introduced by the first interconnection and the second interconnection are in an inversely coupled state.

11. The power circuit of claim 9, wherein the first interconnection interconnects a gate terminal of the first switch circuit to the first driving node, and the second interconnection interconnects a drain terminal of the first switch circuit to the drain node.

12. The power circuit of claim 9, wherein the first interconnection interconnects a gate terminal of the first switch circuit to the first driving node, and the second interconnection interconnects a source terminal of the first switch circuit to the source node.

13. The power circuit of claim 9, wherein the first interconnection interconnects a source terminal of the first switch circuit to the second driving node, and the second interconnection interconnects a drain terminal of the first switch circuit to the drain node.

14. The power circuit of claim 9, wherein the first interconnection interconnects a source terminal of the first switch circuit to the second driving node, and the second interconnection interconnects a source terminal of the first switch circuit to the source node.

15. The power circuit of claim 1, wherein the first interconnection and the second interconnection are inductively coupled to balance transient current flowing through the first switch circuit and the second switch circuit when the first and second switch circuits are switched on/off.

16. The power circuit of claim 1, wherein the first switch circuit includes a first SiC metal-oxide-semiconductor field effect transistor and the second switch circuit includes a second SiC metal-oxide-semiconductor field effect transistor.

17. The power circuit of claim 1, wherein the first switch circuit is on a first die and the second switch circuit is on a second die.

18. The power circuit of claim 17, wherein the first die and the second die are assembled in a package face to face.

19. An apparatus, comprising:
a power circuit having a first switch circuit in parallel with a second switch circuit, the first switch circuit and the second switch circuit being coupled to a first driving node, a second driving node, a source node and a drain node via interconnections, the power circuit receiving a control signal applied between the first driving node and the second driving node to control a current flowing from the drain node to the source node through the first switch circuit and the second switch circuit, wherein a first interconnection and a second interconnection in the interconnections are inductively coupled to balance the current flowing through the first switch circuit and the second switch circuit.

20. A method, comprising:
disposing a first switch circuit and a second switch circuit in parallel in a power circuit;
coupling the first switch circuit and the second switch circuit to a first driving node, a second driving node, a source node and a drain node of the power circuit via interconnections, the power circuit receiving a control signal applied between the first driving node and the second driving node to control a current flowing from the drain node to the source node; and
inductively coupling a first interconnection and a second interconnection in the interconnections to balance the current flowing through the first switch circuit and the second switch circuit.

* * * * *